United States Patent
Schneider

(10) Patent No.: US 10,763,607 B2
(45) Date of Patent: Sep. 1, 2020

(54) ELECTRICAL CONNECTOR

(71) Applicant: Interplex Industries, Inc., East Providence, RI (US)

(72) Inventor: Richard Schneider, Livonia, MI (US)

(73) Assignee: Interplex Industries, Inc., East Providence, RI (US)

( * ) Notice: Subject to any disclaimer, the term of this patent is extended or adjusted under 35 U.S.C. 154(b) by 0 days.

(21) Appl. No.: 16/324,642

(22) PCT Filed: Aug. 21, 2017

(86) PCT No.: PCT/US2017/047800
§ 371 (c)(1),
(2) Date: Feb. 11, 2019

(87) PCT Pub. No.: WO2018/039123
PCT Pub. Date: Mar. 1, 2018

(65) Prior Publication Data
US 2019/0181575 A1    Jun. 13, 2019

Related U.S. Application Data

(60) Provisional application No. 62/377,859, filed on Aug. 22, 2016.

(51) Int. Cl.
*H01R 13/64* (2006.01)
*H01R 12/91* (2011.01)
(Continued)

(52) U.S. Cl.
CPC .......... *H01R 12/91* (2013.01); *H01R 12/585* (2013.01); *H01R 12/73* (2013.01); *H01R 13/115* (2013.01);
(Continued)

(58) Field of Classification Search
CPC ...... H01R 12/91; H01R 43/205; H01R 43/26; H01R 12/585; H01R 12/57; H01R 12/73;
(Continued)

(56) References Cited

U.S. PATENT DOCUMENTS

| 1,978,246 A | 10/1934 | Bauerschmidt |
| 2,751,471 A | 6/1956 | Wills |

(Continued)

FOREIGN PATENT DOCUMENTS

| CN | 203250889 U | 10/2013 |
| DE | 102013105148 A1 | 11/2014 |

(Continued)

OTHER PUBLICATIONS

Presentation entitled "BarKlip BK300 Connector Product Presentation", FCI, Nov. 2015.

(Continued)

*Primary Examiner* — Jean F Duverne
(74) *Attorney, Agent, or Firm* — Katterle Nupp LLC; Paul Katterle; Robert Nupp

(57) ABSTRACT

A connector for connection to a substrate for mounting electronic devices. The connector includes a plurality of coupling contacts pivotably disposed within a housing. Each coupling contact is generally H-shaped and defines opposing first and second spaces. The connector also includes one or more mounting contacts partially disposed within the housing. Each mounting contact has a fastening structure joined to a bar section. The fastening structure is adapted for securement to the substrate and the bar section is disposed in a second space of at least one of the coupling contacts.

20 Claims, 10 Drawing Sheets

(51) Int. Cl.
| | |
|---|---|
| *H01R 12/73* | (2011.01) |
| *H05K 1/14* | (2006.01) |
| *H05K 1/18* | (2006.01) |
| *H01R 12/58* | (2011.01) |
| *H01R 13/115* | (2006.01) |
| *H01R 13/422* | (2006.01) |
| *H01R 43/20* | (2006.01) |
| *H01R 43/26* | (2006.01) |
| *H05K 3/36* | (2006.01) |

(52) U.S. Cl.
CPC ......... *H01R 13/422* (2013.01); *H01R 43/205* (2013.01); *H01R 43/26* (2013.01); *H05K 1/144* (2013.01); *H05K 1/184* (2013.01); *H05K 3/368* (2013.01); *H05K 2201/042* (2013.01); *H05K 2201/1059* (2013.01); *H05K 2201/10189* (2013.01); *H05K 2201/10265* (2013.01); *H05K 2201/10272* (2013.01); *H05K 2201/10303* (2013.01)

(58) Field of Classification Search
CPC .... H01R 12/58; H01R 13/115; H01R 13/422; H05K 2201/10303; H05K 2201/1059; H05K 2201/042; H05K 2201/10272; H02M 7/003
USPC .......................................................... 439/251
See application file for complete search history.

(56) References Cited

U.S. PATENT DOCUMENTS

| | | | |
|---|---|---|---|
| 2,872,659 A | 2/1959 | Wills | |
| 3,201,556 A | 8/1965 | Baird | |
| 4,121,067 A | 10/1978 | Rexroad et al. | |
| 4,423,917 A | 1/1984 | Scheingold et al. | |
| 4,453,792 A | 6/1984 | Bright et al. | |
| 4,486,636 A | 12/1984 | Prietzel et al. | |
| 4,555,604 A | 11/1985 | Maier et al. | |
| 4,616,893 A | 10/1986 | Feldman | |
| 4,749,357 A | 6/1988 | Foley | |
| 4,907,979 A | 3/1990 | Feldman | |
| 5,052,953 A | 10/1991 | Weber | |
| 5,098,318 A | 3/1992 | Suter | |
| 5,139,426 A | 8/1992 | Barkus et al. | |
| 5,156,552 A | 10/1992 | Zaderej et al. | |
| 5,320,541 A | 6/1994 | Korsunsky et al. | |
| 5,431,576 A | 7/1995 | Matthews | |
| D372,220 S | 7/1996 | Matthews | |
| 5,556,286 A | 9/1996 | Ikesugi et al. | |
| 5,813,883 A | 9/1998 | Lin | |
| D411,173 S | 6/1999 | Chau et al. | |
| 6,299,492 B1 | 10/2001 | Pierini et al. | |
| 6,319,021 B1 | 11/2001 | Billman | |
| 6,431,891 B1 | 8/2002 | Billman | |
| 6,604,967 B2 | 8/2003 | Middlehurst et al. | |
| 6,722,926 B2 | 4/2004 | Chevassus-More | |
| 6,923,661 B1 | 8/2005 | Bogiel et al. | |
| 6,974,337 B2 | 12/2005 | Belopolsky et al. | |
| 7,258,562 B2 | 8/2007 | Daily et al. | |
| 7,303,401 B2 | 12/2007 | Schell et al. | |
| 7,314,377 B2 | 1/2008 | Northey et al. | |
| 7,374,436 B2 | 5/2008 | Schell | |
| 7,581,972 B2 | 9/2009 | Daamen et al. | |
| 7,677,934 B2 | 3/2010 | Piovesan | |
| 7,795,551 B2 | 9/2010 | Narayanan et al. | |
| 7,806,711 B2 | 10/2010 | Andersen et al. | |
| 7,905,729 B2 | 3/2011 | Goosens et al. | |
| 7,976,317 B2 | 7/2011 | Patel et al. | |
| 8,043,097 B2 | 10/2011 | Ngo et al. | |
| 8,053,669 B1 | 11/2011 | Sodini et al. | |
| 8,096,814 B2 | 1/2012 | Schell et al. | |
| 8,182,299 B2 | 5/2012 | Schrader | |
| 8,187,017 B2 | 5/2012 | Daily et al. | |
| 8,197,289 B2 | 6/2012 | Faber et al. | |
| 8,360,789 B2 | 1/2013 | Yin et al. | |
| 8,388,389 B2 | 3/2013 | Costello et al. | |
| 8,419,441 B1 | 4/2013 | Topolewski et al. | |
| 8,460,009 B1 | 6/2013 | Topolewski et al. | |
| 8,690,586 B2 | 4/2014 | Schneider | |
| 8,734,167 B2 | 5/2014 | Aimoto | |
| 8,795,001 B1 | 8/2014 | Lam et al. | |
| 8,979,562 B2 | 3/2015 | Crighton et al. | |
| 8,998,618 B2 | 4/2015 | Hashiguchi | |
| 9,054,456 B2 | 6/2015 | Orris et al. | |
| 9,070,990 B2 | 6/2015 | Flickinger et al. | |
| 9,136,625 B2 | 9/2015 | Yu et al. | |
| 9,219,325 B2 * | 12/2015 | Endo ..................... H01R 12/73 |
| 9,257,804 B1 | 2/2016 | Beck et al. | |
| 9,331,409 B2 | 5/2016 | Naganuma et al. | |
| 9,337,597 B2 | 5/2016 | Daamen et al. | |
| 9,379,468 B2 | 6/2016 | Ziemen et al. | |
| 9,419,356 B2 | 8/2016 | Copper et al. | |
| 9,478,889 B2 | 10/2016 | Oshida | |
| 9,559,453 B1 | 1/2017 | Luo | |
| 9,564,696 B2 | 2/2017 | Gulla | |
| 9,577,359 B2 | 2/2017 | Streckewald | |
| 9,620,877 B2 * | 4/2017 | Yao ........................ H01R 12/57 |
| 9,680,236 B2 | 6/2017 | Ngo | |
| 9,698,506 B2 * | 7/2017 | Miyake .................. H01R 12/58 |
| 9,871,309 B2 | 1/2018 | Gao et al. | |
| 9,906,157 B2 * | 2/2018 | Tan ....................... H02M 7/003 |
| 10,128,624 B2 | 11/2018 | Tyler et al. | |
| 10,522,945 B2 | 12/2019 | Schneider et al. | |
| 2012/0156909 A1 | 6/2012 | Tyler | |
| 2016/0093963 A1 | 3/2016 | Streckewald | |
| 2016/0322720 A1 | 11/2016 | Gao et al. | |
| 2017/0324201 A1 | 11/2017 | Schepis et al. | |
| 2018/0254573 A1 | 9/2018 | Copper et al. | |
| 2018/0301834 A1 | 10/2018 | Dandl et al. | |
| 2019/0081439 A1 | 3/2019 | Schneider et al. | |
| 2020/0067234 A1 | 2/2020 | Schneider et al. | |

FOREIGN PATENT DOCUMENTS

| | | |
|---|---|---|
| EP | 2698877 A1 | 2/2014 |
| WO | 2014/172250 A1 | 10/2014 |
| WO | 2017/044653 A1 | 3/2017 |
| WO | 2018/039123 A1 | 3/2018 |
| WO | WO2019/099829 A1 | 5/2019 |

OTHER PUBLICATIONS

International Search Report and the Written Opinion of the International Searching Authority, dated Oct. 27, 2017, for PCT/US2017/47800, filed Aug. 21, 2017.
Communication Relating to the Results of the Partial International Search, dated Jan. 30, 2019, from PCT/US2018/061521, filed on Nov. 16, 2018.
Search Report and Written Opinion dated Oct. 27, 2017, from corresponding International Application No. PCT/US/2017/047800.
Amendment filed in EP17844212 (which is the EP application corresponding to U.S. Appl. No. 16/324,642), dated Sep. 9, 2019.
Supplementary European Search Report for EP17844212, dated Mar. 11, 2020.
Office action for U.S. Appl. No. 16/673,298 (which shares priority with U.S. Appl. No. 16/324,642), dated Jan. 9, 2020.
Response to Office action for U.S. Appl. No. 16/673,298, dated Jan. 13, 2020.
Notice of Allowance for U.S. Appl. No. 16/673,298, dated Feb. 19, 2020.
International Preliminary Report on Patentability for PCT/US2017/047800, dated Feb. 26, 2019.
May 29, 2020 Search Report from Singapore Patent Office for corresponding Singapore patent application.

* cited by examiner

ELECTRICAL CONNECTOR

CROSS-REFERENCE TO RELATED APPLICATION(S)

This application claims priority to PCT/US2017/047800, filed Aug. 21, 2017, which claims priority under 35 U.S.C. § 119(e) to Provisional Patent Application No. 62/377,859, filed on Aug. 22, 2016, all of which are herein incorporated by reference in their entirety.

TECHNICAL FIELD

The present disclosure relates to an electrical connector for connecting electronic and/or electrical parts that may be misaligned.

BACKGROUND

In an electronic system it is necessary to establish electrical connections between constituent parts of the system. Often, these parts are relatively rigid and have fixed locations where the parts are to be connected together. For example, the parts that are to be connected together may be printed circuit boards (PCBs) and the connection locations may be plated through-holes in the PCBs. While each PCB may be produced in compliance with strict tolerances, the connection locations between the PCBs may nonetheless become misaligned due to tolerance stacking or other reasons.

A misalignment between the connection locations of parts can cause mating problems when the parts are connected together (or attempted to be connected together). For example, as set forth above, one or both of the parts may be a PCB with plated through-holes as connection points. In such a situation, a connector is typically secured to the through-holes using soldering or press-fit connections. Such connections, which are rigid and relatively fragile, can be physically damaged by errant forces that are produced when the misaligned parts are brought together. Even if the parts are not damaged, the electrical connections may not be as robust as they should be, due to the misalignment.

Based on the foregoing, it would be desirable to provide an electrical connector for electrically connecting parts, wherein the connector accommodates misalignment between the parts.

SUMMARY

A connector is disclosed for connection to a substrate for mounting electronic devices. The substrate may have a plurality of holes formed therein. The connector includes a housing having opposing first and second end openings. A coupling contact is pivotably disposed within the housing. The coupling contact includes a pair of elements having opposing first and second end portions, respectively. The elements are joined together, intermediate the first and second end portions. The first end portions are separated by a first space and the second end portions are separated by a second space. The first space is aligned with the first end opening in the housing and the second space is aligned with the second end opening in the housing. The connector also includes a mounting contact that is partially disposed within the housing. The mounting contact has a fastening structure joined to a bar section. The fastening structure is adapted for insertion into one of the holes of the substrate and the bar section is disposed in the second space of the coupling contact.

In one aspect of the disclosure, the housing has a pair of opposing side walls, with one of the side walls having an opening. In addition, the connector comprises a plurality of the contact plates, wherein the coupling contacts are arranged side by side in a stack in the housing such that the first spaces are aligned to form a first receiving groove and the second spaces are aligned to form a second receiving groove, which is aligned with the opening in the side wall of the housing. The bar section of the mounting contact is disposed in the second receiving groove.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
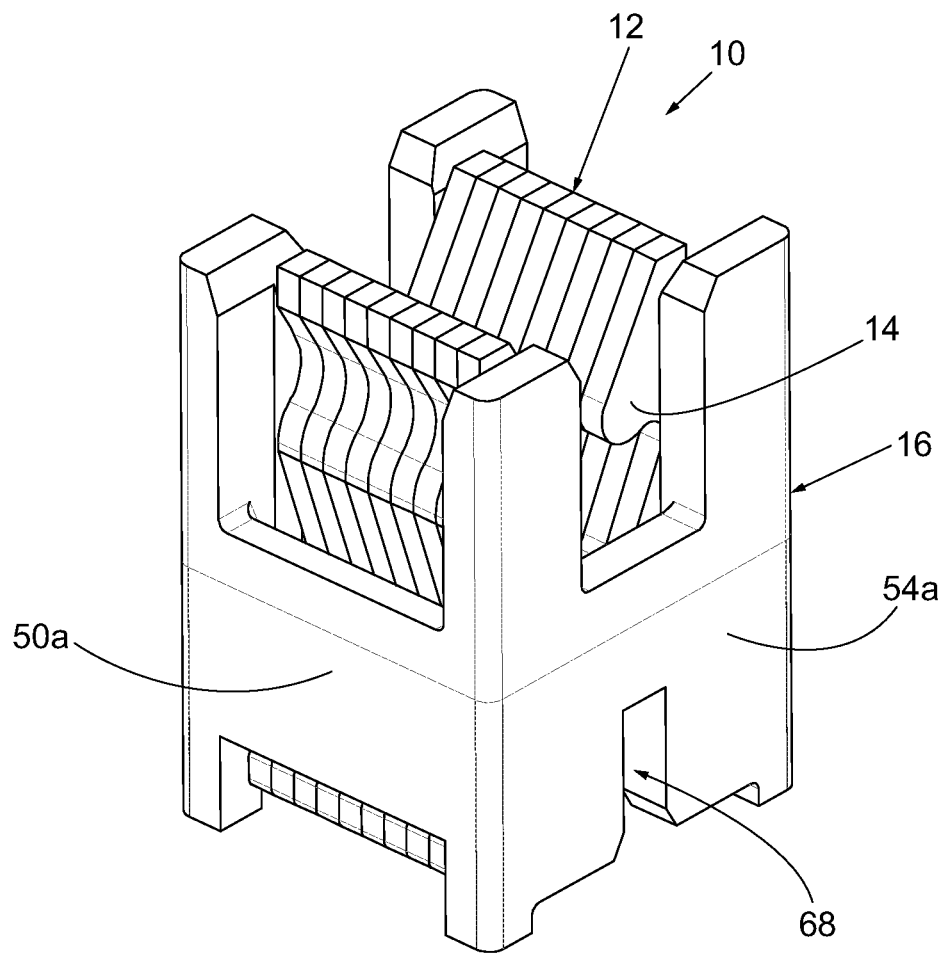
FIG. 1 shows a perspective view of a coupler of the disclosure.

It should be noted that in the detailed descriptions that follow, identical components have the same reference numerals, regardless of whether they are shown in different embodiments of the present disclosure. It should also be noted that for purposes of clarity and conciseness, the drawings may not necessarily be to scale and certain features of the disclosure may be shown in somewhat schematic form.

Figure 2:
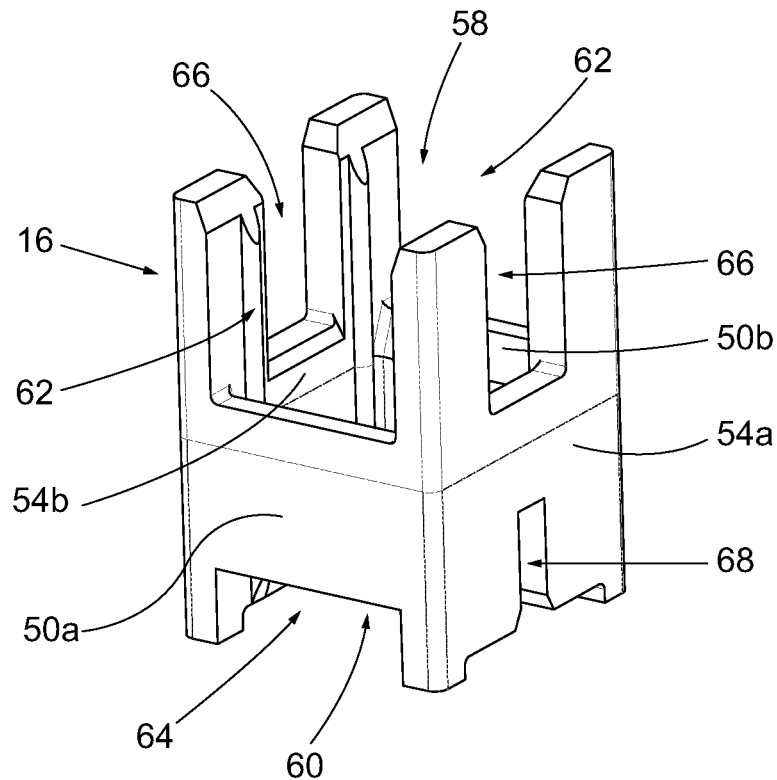
FIG. 2 shows a partially disassembled perspective view of the coupler with a stack of contact plates removed from a housing.
Figure 2:
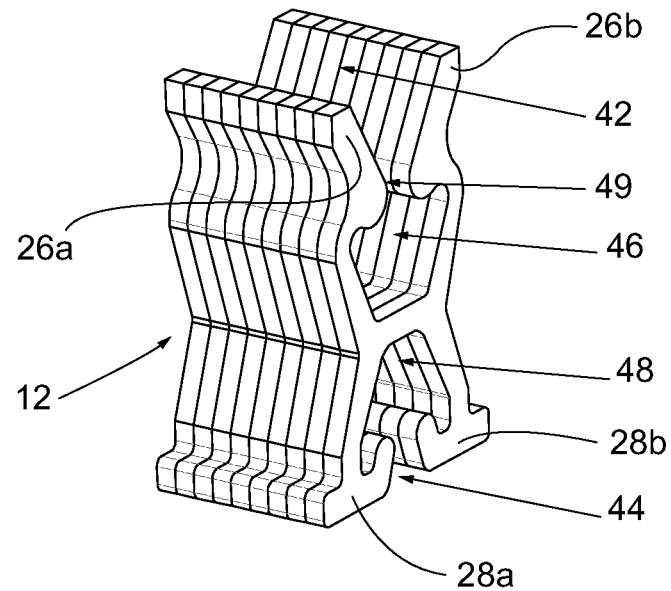
Figure 3:
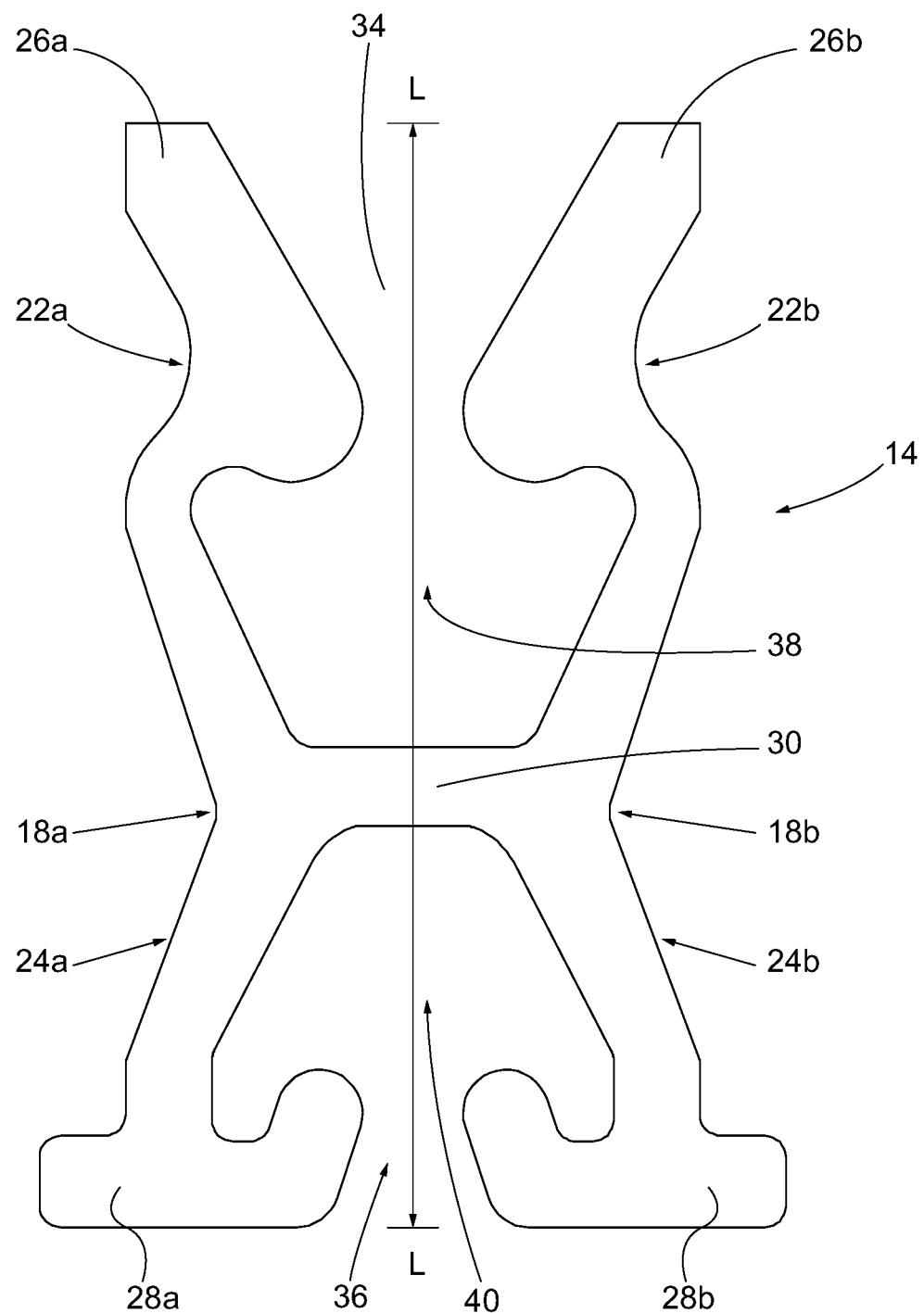
FIG. 3 shows a plan view of one of the contact plates.

Referring now to FIGS. 1 and 2, there is shown a coupler 10 constructed in accordance with this disclosure. The coupler 10 is comprised of a stack 12 of contact plates 14 disposed in a housing 16. Each of the contact plates 14 is a unitary or monolithic structure and is electrically conductive, being composed of a conductive metal, such as a tin plated copper alloy. As best shown in FIG. 3, each contact plate 14 includes a pair of irregular-shaped elements or legs 18a,b. Each leg 18a,b includes an upper first portion 22a,b with a dog leg configuration and a lower second portion 24a,b with a generally L-shaped configuration. The first portion 22a,b includes a first end portion 26a,b that angles outwardly, relative to a longitudinal center axis L of the contact plate 14, which extends between the legs 18a,b. The second portion 24a,b includes a second end portion 28a,b that extends laterally inward from an outer heel and then, towards the longitudinal center axis L, bends upward. The legs 18a,b are joined together by a cross bar 30, intermediate the first and second end portions 26a,b, 28a,b. The cross bar 30 extends laterally between the legs 18a,b and helps give the contact plate 14 a general H-shape. The first end portions 26a,b define a first receiving space 34 therebetween, while the second end portions 28a,b define a second receiving space 36 therebetween. Each of the first receiving spaces 34 has a wide outer portion and a narrow inner portion, thereby giving the first receiving space a general V-shape. Each of the second receiving spaces 36 is also V-shaped; however, the first receiving space 34 is larger and its V-shape is more pronounced than the second receiving space 36. The first receiving space 34 adjoins a first inner space 38, while the second receiving space 34 adjoins a second inner space 40.

As shown, the contact plates 14 are disposed side-by-side, with their planar surfaces adjoining each other, to form the stack 12. However, in other embodiments, the contact plates 14 may be separated by spaces, respectively. The contact plates 14 are aligned with each other such that the first receiving spaces 34 form a first receiving groove 42 and the second receiving spaces 36 form a second receiving groove 44. Similarly, the first inner spaces 38 form a first inner passage 46 and the second inner spaces form a second inner passage 48. The narrowest portion of the first receiving groove 42, which directly adjoins the first inner passage 46 and is formed by the narrow inner portions of the first receiving spaces 36, is referred to as the contact zone 49. The first and second receiving grooves 42, 44 and the first and second inner passages 46, 48 extend in the stacking direction, which is normal to the planar surfaces of the contact plates 14. The number of contact plates 14 that are used is determined by the amount of electrical current the coupler 10 is designed to handle, with the current carrying capacity of the coupler 19 being increased by increasing the number of contact plates 14 used. Other factors that affect the current carrying capacity of the coupler 10 include the thickness of each contact plate 14, the type of plating used and the composition of the underlying metal structure.

The housing 16 is generally cuboid and is composed of an insulative material, such as plastic. The interior of the housing 16 is hollow and is sized to receive the stack 12 of contact plates 14 in a press fit operation, i.e., the interior is smaller in one or more dimensions than the stack 12. The housing 16 includes opposing first side walls 54a,b, opposing second side walls 50a,b and opposing first and second open ends 58, 60. The second side walls 50a,b each have a rectangular major opening 62 disposed toward the first open end 58 and a rectangular minor opening 64 disposed toward the second open end 60. The first side walls 54a,b each have a rectangular major slot 66 disposed toward the first open end 58 and a rectangular minor slot 68 disposed toward the second open end 60.

The contact plates 14 are secured within the housing 16 in a press-fit operation in which the stack 12 as a whole is pressed into the housing 16 through the second open end 60. The resulting interference fit between the stack 12 and the housing 16 secures the contact plates 14 within the housing 16, but permits pivoting motion of the contact plates 14, as will be discussed more fully later.

The contact plates 14 are disposed within the housing 16 such that the first receiving spaces 34 of the contact plates 14 are aligned with the first open end 58 of the housing 16 and the second receiving spaces 36 of the contact plates 14 are aligned with the second open end 60 of the housing 16. In addition, the first receiving groove 42 of the stack 12 is aligned with the major slots 66 in the housing 16 and the second receiving groove 44 of the stack 12 is aligned with the minor slots 68 in the housing 16.

For purposes of facilitating description, components of the coupler 10 may be described with regard to X, Y, Z spatial coordinates, which are as follows: the X-axis extends through the first side walls 54a,b of the coupler 10, the Y-axis extends through the second side walls 50a,b of the coupler 10, and the Z-axis extends through the first and second open ends 58, 60 of the coupler 10.

The coupler 10 may be used in a variety of applications. In one application, the coupler 10 may be used to connect together two bus bars, with one bus bar being disposed in the first receiving groove 42 and the other bus bar being disposed in the second receiving groove 44. The major slots 66 and the minor slots 68 in the housing 16 permit the coupler 10 to receive the bus bars from different angles or directions. For example, both the first receiving groove 42 and the second receiving groove 44 may receive a bus bar that is oriented with its longitudinal axis parallel to the X-axis of the coupler 10 or parallel to the Y-axis of the coupler 10. In this manner, the two bus bars connected by the coupler 10 can be arranged parallel to each other in the direction of the X-axis or the Y-axis, or arranged perpendicular to each other.

In another application, the coupler 10 may be used to connect an edge connector of a PCB to a bus bar, an electrical/electronic device, or an edge connector of another PCB. The PCB edge connector may be disposed in the second receiving groove 44, while a bus bar, bar-like portion of the electrical/electronic device or an edge connector of the other PCB may be disposed in the first receiving groove 42.

Figure 4:
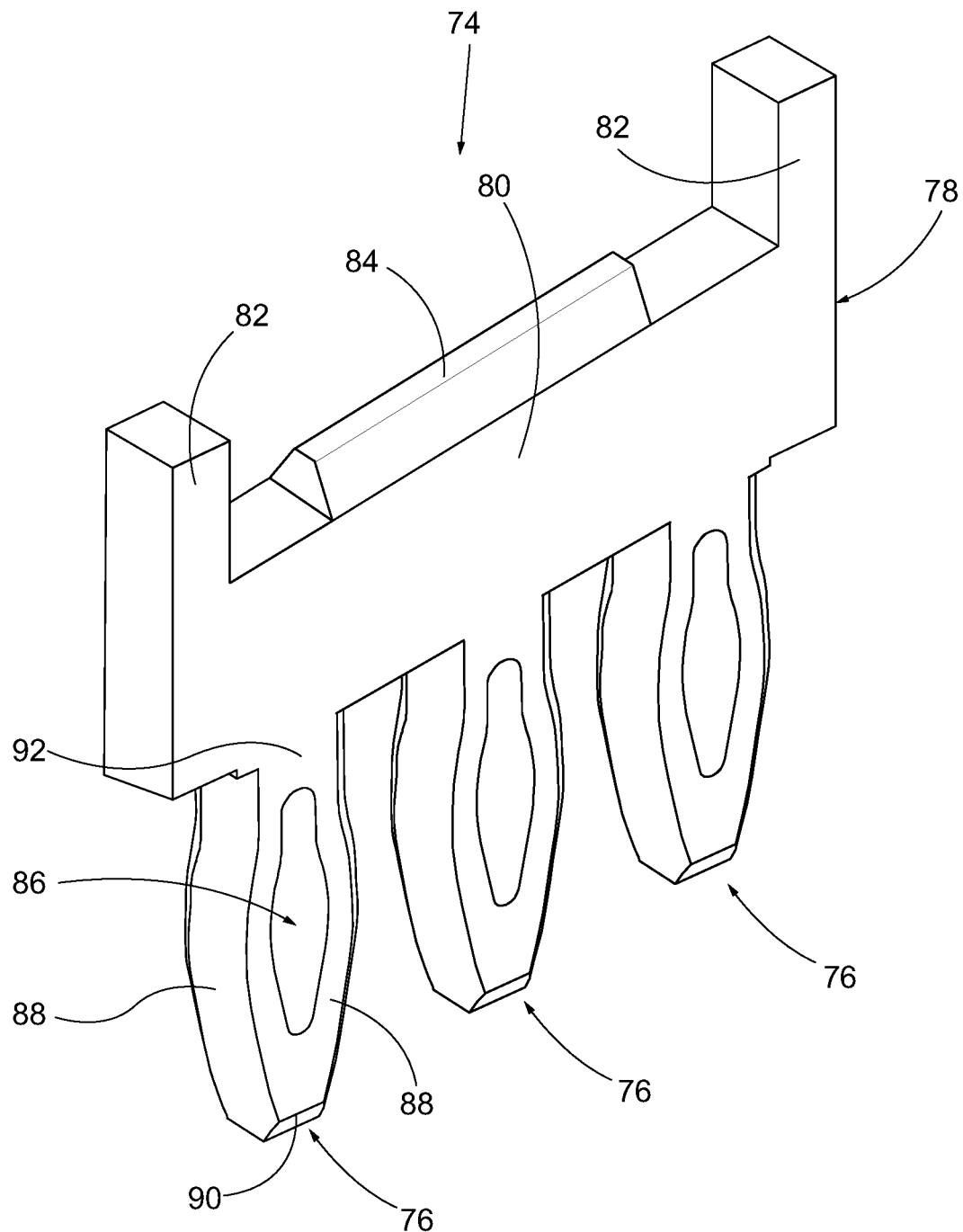
FIG. 4 shows a perspective view of a mounting contact for connection to the coupler.

In still another application, a mounting contact may be used to mount the coupler 10 to a substrate, such as a printed circuit board (PCB). Different embodiments of the mounting contact may be used, depending on the requirements of a particular application. One embodiment of the mounting contact (designated by the reference numeral 74) is shown in FIG. 4. The mounting contact 74 is a monolithic structure and is electrically conductive, being composed of a conductive metal, such as a tin plated copper alloy. The mounting contact 74 includes fastening structures 76 joined to a bar section 78. The bar section 78 is channel-shaped, having a center beam 80 joined between opposing, outwardly-extending arms 82. A blade 84 is joined to an upper portion of the beam 80 and has beveled surfaces that form an elongated edge. The blade 84 does not span the entire length of the beam 80 between the arms 82, but is, instead, separated by spaces from the arms 82, respectively. The blade 84 helps guide the beam 80 into the second receiving groove 44 and the second inner passage 48 of the stack 12 of contact plates 14.

The fastening structures 76 are joined to a lower portion of the beam 80 and extend outwardly therefrom, in a direction opposite the arms 82. Each fastening structure 76 may have a press-fit construction. More particularly, each fastening structure 76 may have an eye-of-the-needle (EON) type of press-fit construction. With this type of construction, each fastening structure 76 includes a center piercing 86 forming a pair of beams 88 that bow outwardly and are joined at an outer tip 90 and at an inner neck 92, which is joined to the beam 80. Each fastening structure 76 is adapted to be press-fit into a hole in a substrate, such as the plated hole in the PCB shown in FIG. 7. As the fastening structure 76 is being press-fit into the hole, the beams 80 initially deflect inward and then resiliently move outward to provide a normal force against the PCB hole, thereby providing a reliable physical and electrical connection.

The fastening structures used in the mounting contact 74 are not limited to having an EON-type of press fit construction. Instead, fastening structures having a different press-fit construction may be used, or the fastening structures may simply be elongated pins that are soldered into the holes of a PCB. In still another embodiment, the mounting contact 74 may have a single fastening structure that includes a mount joined to the beam 80, wherein the mount has a lower enlarged planar surface that may be soldered to a metal plate of an insulated metal substrate, such as a metal core printed circuit board.

Figure 5:
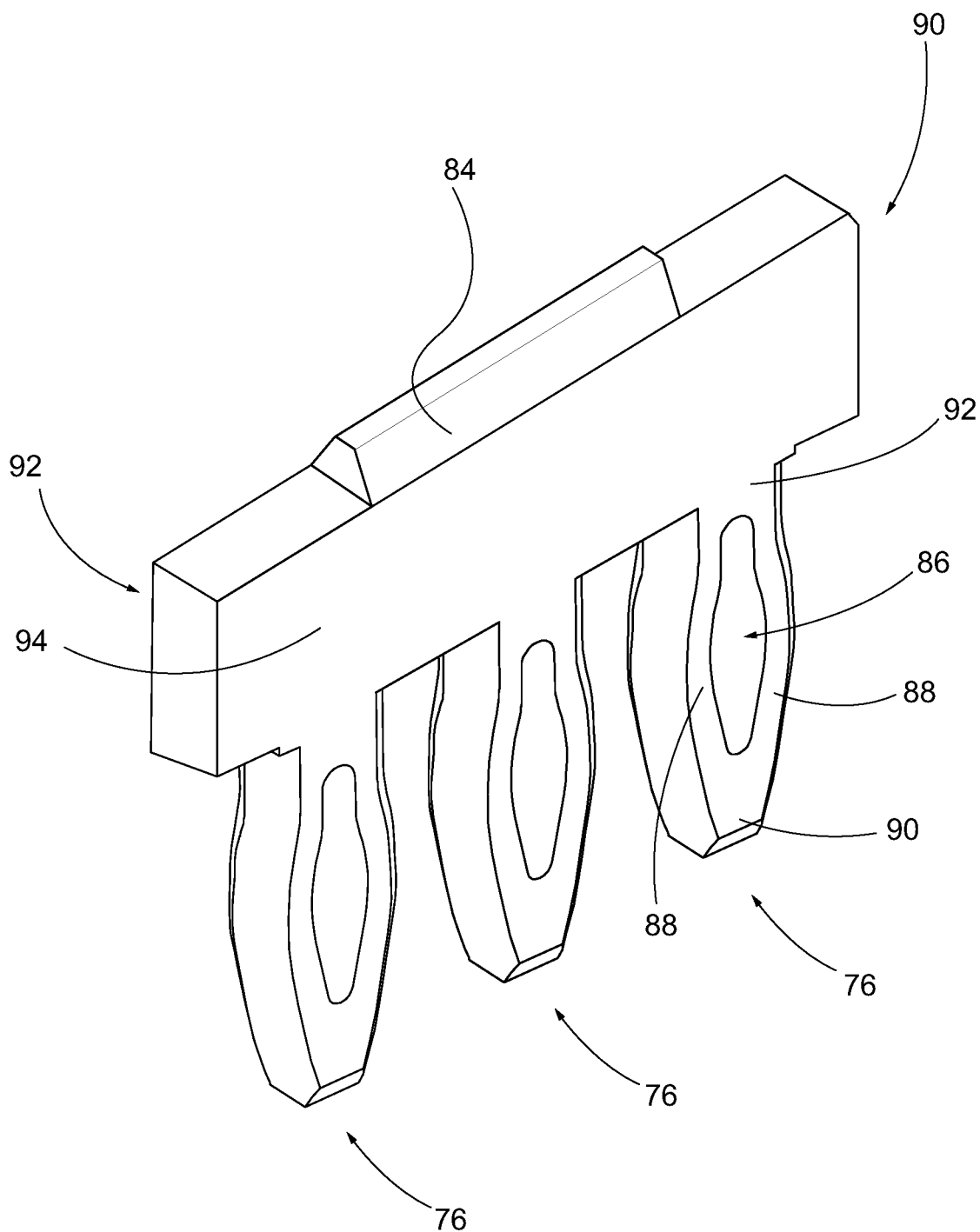
FIG. 5 shows a perspective view of a connecting contact for connection to a printed circuit board.

The coupler 10 may be used with a connecting contact to connect together two substrates, such as two PCBs, especially when higher currents (30 amps or greater) are involved. Referring now to FIG. 5, such a connecting contact 90 is shown. The connecting contact 90 has the same construction as the mounting contact 74, except the connecting contact 90 has a bar section 92 that is different from the bar section 78. More specifically, the bar section 92 only has a center beam 94, without any outwardly-extending arms. A blade 84 is joined to an upper portion of the beam 94. Fastening structures 76 are joined to a lower portion of the beam 94 and extend outwardly therefrom. As shown, each fastening structure 76 may have an EON type of press-fit construction.

Figure 6:
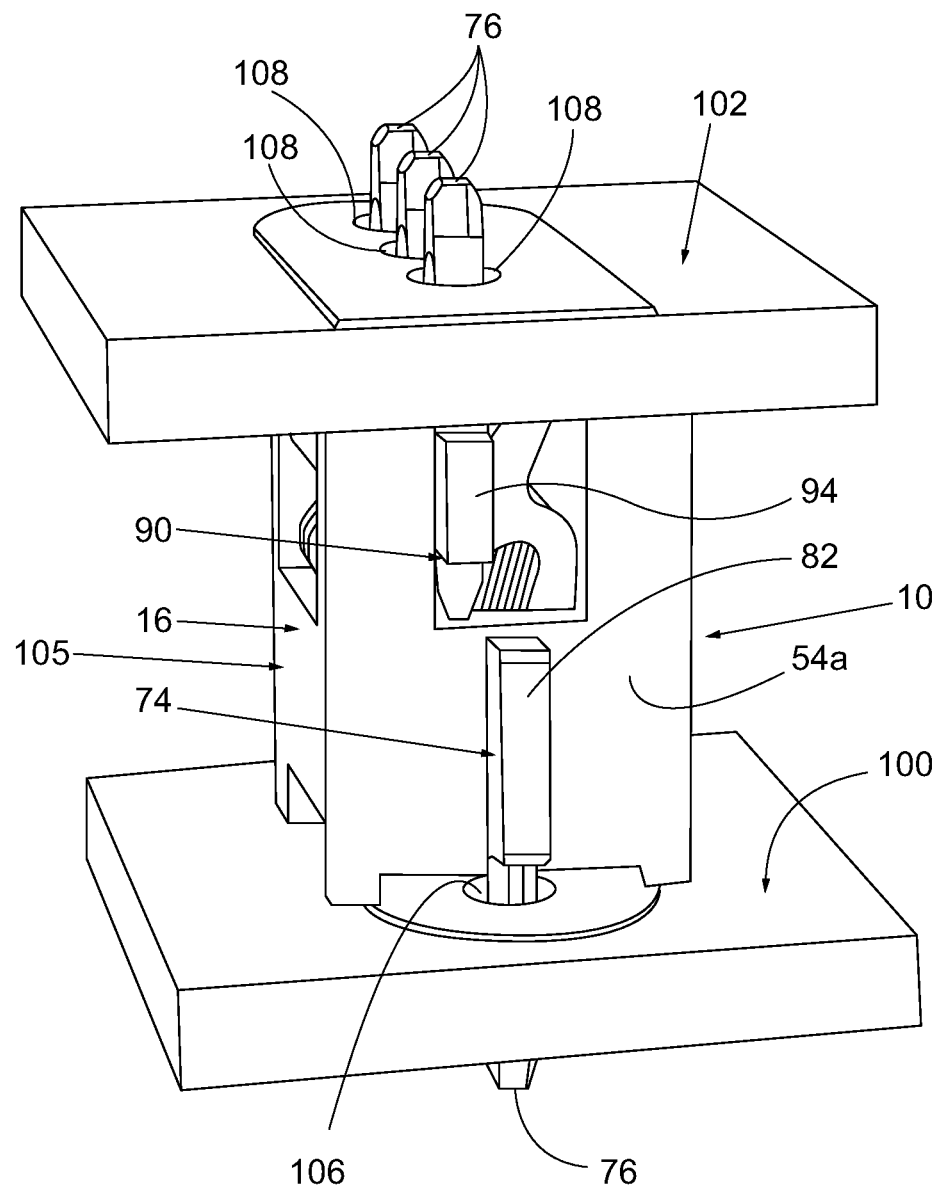
FIG. 6 shows a perspective view of a combination of the coupler, mounting contact, connecting contact and a pair of printed circuit boards.
Figure 7:
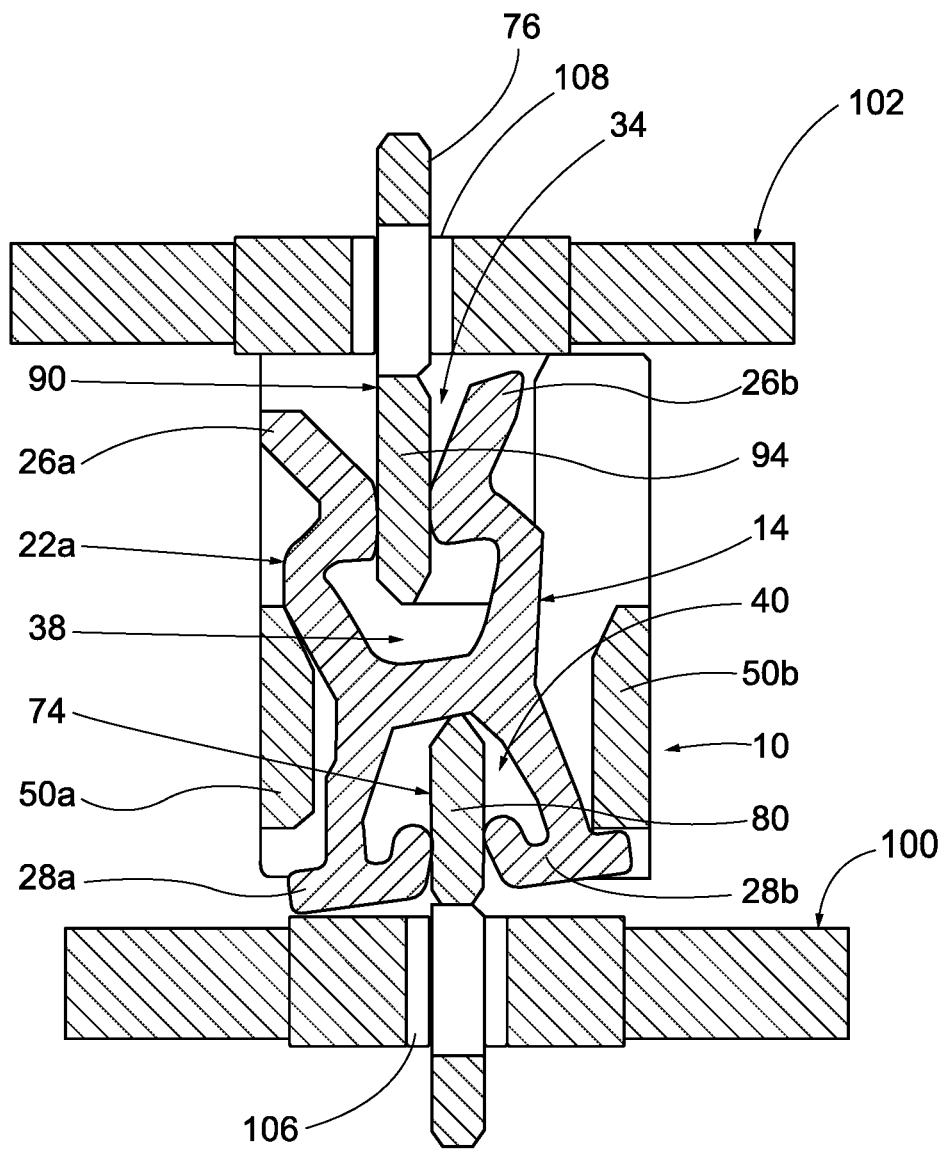
FIG. 7 shows a sectional view of the combination of FIG. 6.

Referring now to FIGS. 6 and 7, the coupler 10, the mounting contact 74 and the connecting contact 90 are shown connecting together two PCBs 100, 102, each of which has a plurality of plated through-holes that are electrically conductive. The process of connecting together the PCBs 100, 102 begins with the coupler 10 and the mounting contact 74 being mounted to the PCB 100, and the connecting contact 90 being mounted to the PCB 102. The PCB 102 is then connected to the PCB 100 by inserting the connecting contact 90 into the coupler 10.

The mounting contact 74 is secured to the coupler 10 by aligning the bar section 78 of the mounting contact 74 with the second receiving groove 44 of the coupler 10 and then applying a force to the mounting contact 74, while the coupler 10 is held still. The blade 84 guides the beam 80 into the second receiving groove 44 and the second inner passage 48 of the stack 12 of contact plates 14. The force is released when the beam 80 contacts inner edges of the first side walls 54a,b defining upper ends of the minor slots 68. At this point, the beam 80 extends through both the second inner passage 48 and the second receiving groove 44 and the arms 82 adjoin the first side walls 54a,b of the housing 16. In addition, the second end portions 28a,b of the contact plates 14 press against the beam 84, thereby electrically connecting the coupler 10 to the mounting contact 74. As will be discussed in more detail below, the combination of the coupler 10 and the mounting contact 74 forms a connector 105 that permits the PCB 100 to be connected to the PCB 102, even though the PCBs may be misaligned.

Next, the connector 105 is secured to the PCB 100. The fastening structures 76 are aligned with plated holes 106 in the PCB 100, respectively, and then a force is applied to the connector 105, such as against the outer ends of the arms 82. The fastening structures 76 deform as they enter the holes 106 and then resiliently spring back to secure the fastening structures 76 within the holes 106. The connector 105 is now physically and electrically connected to the PCB 100. It should be appreciated that with the housing 16 trapped between the arms 82 of the mounting contact, the coupler 10 is provided with additional stability relative to the PCB 100 in the direction of the X-axis.

The connecting contact 90 is mounted to the PCB 102 by aligning the fastening structures 76 with plated holes 108 in the PCB 102, respectively, and then applying a force, such as against outer end portions of the beam 94. The fastening structures 76 deform as they enter the holes 108 and then resiliently spring back to secure the fastening structures 76 within the holes 108, thereby physically and electrically connecting the connecting contact 90 to the PCB 102.

The PCB 102 is connected to the PCB 100 by inserting the beam 94 of the connecting contact 90 (secured the PCB 102) into the first receiving groove 42 of the connector 105 (secured to the PCB 100). Since the PCB 102 and the PCB 100 are rigid bodies and they are to be connected with a low Z-space therebetween, there may be some misalignment in the Y-direction between the beam 94 and the first receiving groove 42. To better illustrate the operation of the connector 105, the beam 94 is shown as being offset to the left (as viewed from FIG. 7) from the longitudinal center axes L of the contact plates 14. The connector 105, however, accommodates this misalignment. As the beam 94 moves into the first receiving groove 42, the blade 84 contacts sloping inner surfaces of the first end portions 26a of the contact plates 14, which causes the contact plates 14 to pivot about the beam 80 (the X-axis) in a counterclockwise direction (as viewed from FIG. 7) and guide the beam 94 into the contact zone 49. The major opening 62 in the second side wall 50a permits this pivoting by receiving the first end portions 26a of the legs 18a of the contact plates 14. The pivotal movement of the contact plates 14 is shown in FIG. 7 and is about eight and a quarter degrees. Even though the contact plates 14 have pivoted out of their normal position, they still maintain a good physical and electrical connection with the beam 94, thereby establishing a good physical and electrical connection between the PCB 102 and the PCB 100. As shown in FIG. 7, the beam 94 is pressed between inner surfaces of the first end portions 26a,b of the contact plates 14 in the contact zone 49.

It should be appreciated that in addition to accommodating misalignment in the Y-direction, the connector 105 also accommodates misalignment in the X-direction and the Z-direction, as well as angular or twist misalignment in any of the three directions. The alignment of the the first receiving groove 42 with the major slots 66 permits the beam 94 to be offset in the X-direction vis-a-vis the first receiving groove 42 and still make a good physical and electrical connection with the contact plates 14. In the Z-direction, the beam 94 does not need to extend into the first inner passage 46 to the full extent possible to make a good physical and electrical connection.

Another advantage provided by the connector 105 is that it accommodates movement between parts that may occur after the parts have been connected. For example, the parts may move relative to each other due to environmental factors, such as temperature, vibration, impact or handling. The connector 105 permits this relative movement, while still maintaining a good electrical and physical connection between the parts.

In addition to being well suited to connect together two PCBs, the connector 105 is well suited to connect together other rigid electronic components. In particular, the attributes of the connector 105 make it especially well suited for connecting a bus bar to a PCB to supply power thereto. These attributes of the connector 105 include its small X-Y footprint, its ability to connect together misaligned rigid bodies and its ability to accommodate larger currents.

Indeed, the current capacity of the connector 105 is scalable by changing the number of contact plates 14 used and/or changing the thickness, plating or structural composition of the contact plates 14. Current capacities of 30 amps or more are achievable. When used to connect a bus bar to a PCB, such as the PCB 100, an end or a portion of the bus bar is disposed within the first receiving groove 42 and the first inner passage 46 such that the enlarged planar surfaces of the bus bar engage the inner surfaces of the first end portions 26a,b of the contact plates 14 in the contact zone 49. Multiple connectors 105 may be used to mount a bus bar to a PCB.

Figure 8:
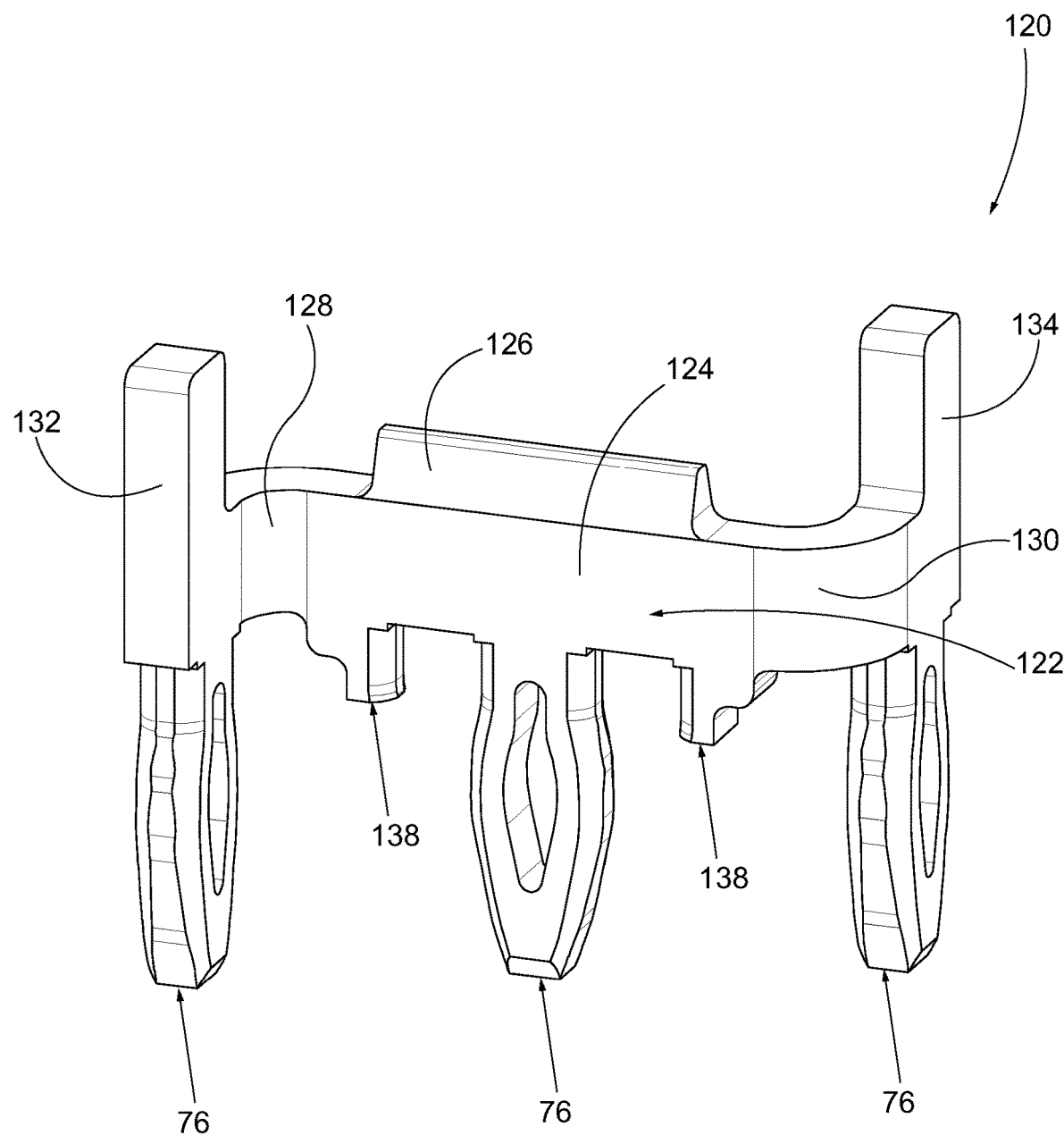
FIG. 8 shows a perspective of a lead frame for connection to the coupler.

Depending on a particular connection between a PCB and bus bar, the connector 105 may be modified to provide more stability against rotating or tipping relative to the PCB as a result of the forces that may be applied by the bus bar. One such modification may be to replace the mounting contact 74 with a different type of mounting contact. For example, the mounting contact 74 may be replaced with the mounting contact or lead frame 120, which is shown in FIG. 8. The lead frame 120 is a monolithic, generally Z-shaped structure and is electrically conductive, being composed of a conductive metal, such as a tin plated copper alloy. The lead frame 120 has a bar section 122 with fastening structures 76 extending outwardly therefrom. The bar section 122 includes a center beam 124 having opposing ends joined by bends 128 130 to arms 132, 134, respectively. The bends 128, 130 curve in opposing directions to give the lead frame 120 its Z-shape. A blade 126 is joined to an upper portion of the beam 124 and has beveled surfaces that form an elongated edge. The arms extend upwardly beyond the blade 126. Two of the fastening structures 76 are joined to lower portions of the arms 132, 134, respectively, and extend downwardly therefrom. A third (or center) fastening structure 76 is joined to a lower portion of the beam 124 and extends downwardly therefrom. A pair of supports 138 are also joined to the lower portion of the beam 124 and extend downwardly therefrom. The supports 138 bracket the center fastening structure 76.

It should be appreciated that the lead frame 120 may be modified to have a greater or lesser number of fastening structures 76 or to have a different configuration. For example, instead of the bends 128, 130 curving in opposing directions, the bends 128, 130 may curve in the same direction, which would give the lead frame 120 a general U-shape. Still another example would be having only one of the bends 128, 130 so that the lead frame 120 has a general L-shape.

Figure 9:
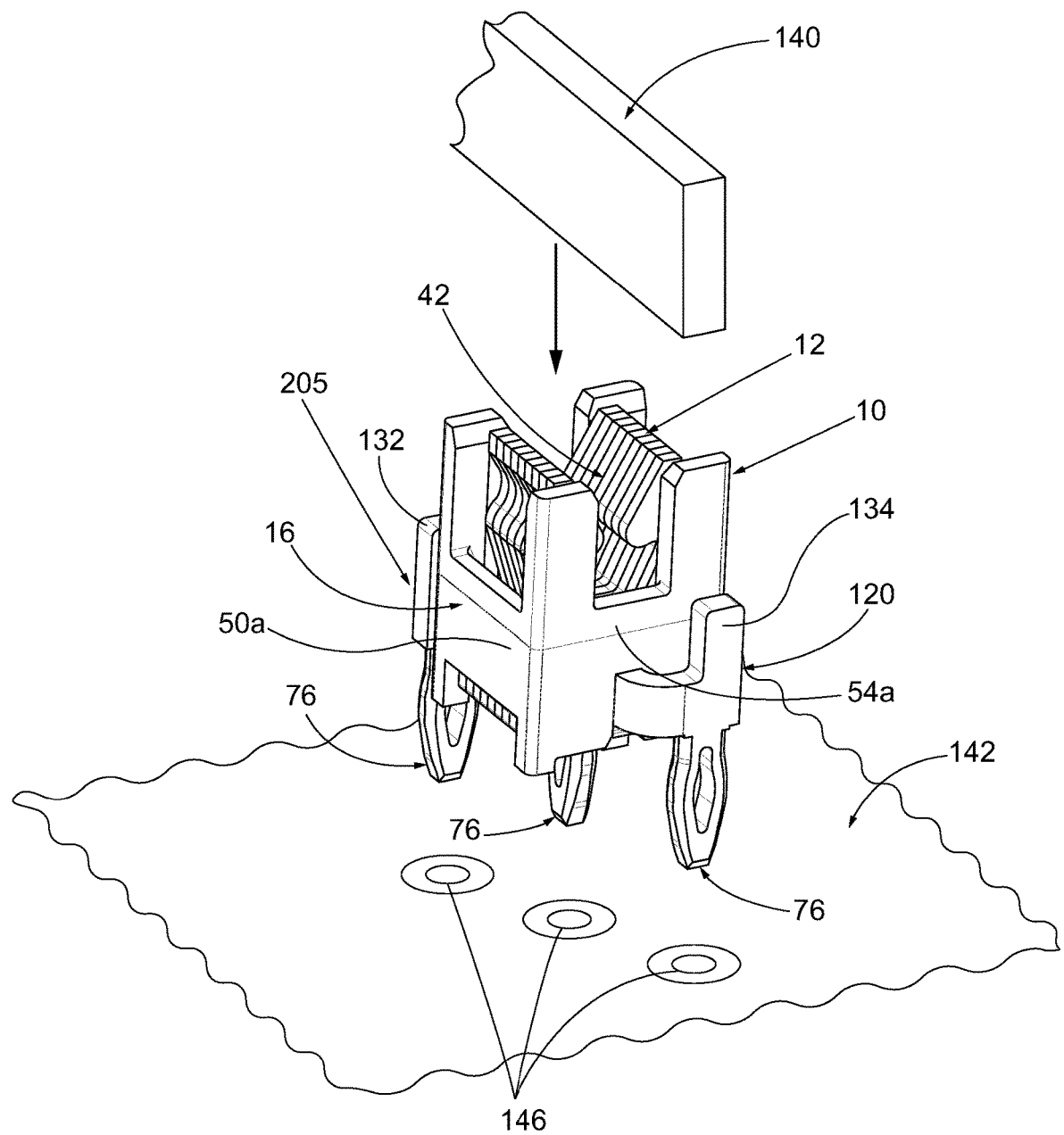
FIG. 9 shows a perspective view of the lead frame connected to the coupler disposed between a bus bar and a printed circuit board.

Referring now to FIG. 9, the lead frame 120 is shown mounted to the coupler 10 to form a connector 205, which will help connect a bus bar 140 to a PCB 142 to provide power thereto. Although not shown, multiple connectors 205 may be used to mount the bus bar 140 to the PCB 142. The lead frame 120 is mounted to the the coupler 10 by inserting the beam 124 into the second receiving groove 44 and the second inner passage 48 of the coupler 10. With the beam 124 so positioned, the arms 132, 134 are disposed against the first side walls 54a,b of the coupler 10, respectively. However, the first arm 132 is positioned against the first side wall 54b, toward the second side wall 50a, while the second arm 134 is positioned against the first side wall 54a, toward the second side wall 50b.

In the connector 205, the fastening structures 76 are not arranged in the direction of the the X-axis, parallel to the second receiving groove 44, as in the coupler 105. Instead, the fastening structures 76 are arranged diagonal to the X-axis. Moreover, the fastening structures 76 are not all positioned with their widths (beam to beam) extending in the direction of the X-axis, as in the coupler 105. Instead, the outer fastening structures 76 are positioned with their widths extending in the direction of the Y-axis, while the middle fastening structure 76 (joined to the beam 124) is positioned with its width extending in the direction of the X-axis. When the connector 205 is mounted to the PCB 142 by press-fitting the fastening structures 76 into the plated holes 146 of the PCB 142, the foregoing arrangement of the fastening structures 76 helps prevent the connector 205 from pivoting about the X-axis and otherwise moving due to torsional and other forces applied by the bus bar 140. In this regard, it should be noted that when the connector 205 is mounted to the PCB 142, the supports 138 of the lead frame 120 contact the surface of the PCB 142 and help provide additional support for and stability to the connector 205.

As shown in FIG. 9, the connector 205 may be used to mount a bus bar to a PCB so that the enlarged planar surfaces and the short edges of the bus bar are disposed perpendicular to the plane of the PCB, while the long edges of the bus bar are parallel to the plane of the PCB. In order to mount a bus bar to a PCB in orientations different than this, the connector 205 may be modified. For example, if it is desired to mount a bus bar to a PCB so that the enlarged planar surfaces of the bus bar are parallel to the plane of the PCB, the connector 205 may be modified to be mounted to the PCB so that both the longitudinal axes L of the contact plates and the first receiving groove 42 are parallel to the plane of the PCB, i.e., one of the second side walls 50a,b is disposed adjacent to the PCB. The modifications utilized to accomplish this change in mounting may include modifying the lead frame 120 to remove the blade 126 and join an elongated tab or bar to the end of the arm 132, wherein the bar extends rearwardly, with its planar surfaces disposed perpendicular to the arm 132. The bar is inserted into the second receiving groove 44 of the coupler 10 and the fastening structures 76 are press-fit into holes in the PCB.

Other modifications may be made to the lead frame 120 to mount the coupler 10 to a PCB in still other orientations. For example, the lead frame 120 may be modified to replace the blade 126 with an elongated tab or bar, which would be inserted into the second receiving groove 44 of the coupler 10. This modification of the lead frame 120 would permit the coupler 10 to be mounted to a PCB such that the one of the first side walls 54a,b is disposed adjacent to the PCB.

Figure 10:
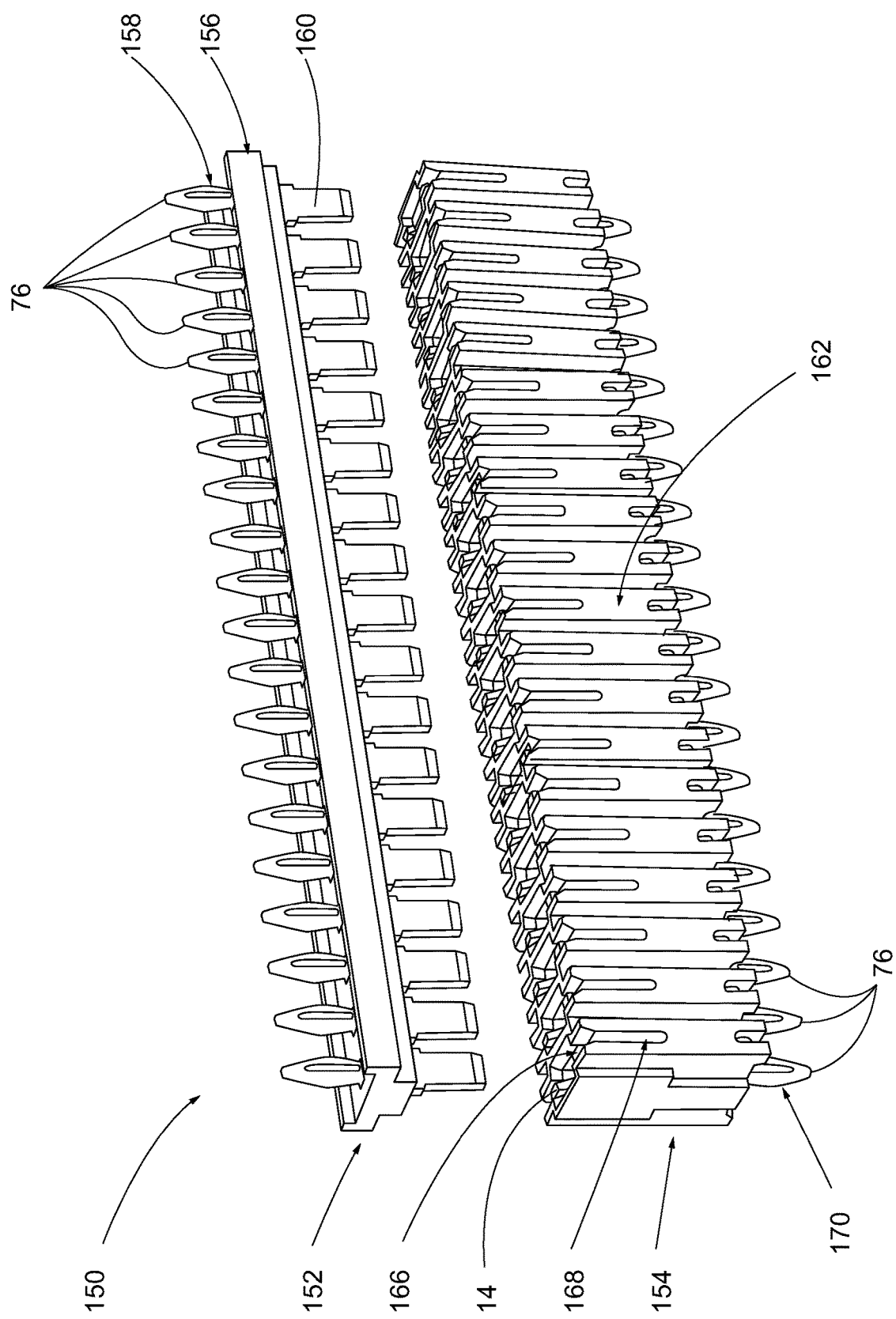
FIG. 10 shows a perspective view of a pair of connectors.

Referring now to FIG. 10, there is shown a connector assembly 150 for connecting together first and second PCBs to permit low current signals to be transmitted therebetween. The connector assembly 150 includes a connector 152 and a connector 154

The connector 152 includes a plurality of signal contacts 158 secured to a housing 156 composed of insulating material, such as plastic. Each of the signal contacts 158 is a monolithic structure and is electrically conductive, being composed of a conductive metal, such as a tin plated copper alloy. Each signal contact 158 includes a fastening structure 76 joined at its neck to a spade 160 with a beveled end. The fastening structures 76 and the the spades 160 extend outwardly from the housing 156 in opposing directions. The fastening structures 76 are adapted to be press-fit into plated holes in a first PCB.

The connector 154 includes a housing 162 composed of insulating material, such as plastic. The housing 162 has a plurality of pockets 166 arranged serially along its length. The pockets 166 have open top and bottom ends and are separated from each other by interior walls. A series of side slots 168 are formed in the front and rear sides of the housing 162, with each pocket 166 having a pair of opposing slots 168. A single contact plate 14 is press-fit into each pocket 166 such that the first portions 22a,b of the legs 18a,b are aligned with the opposing slots 168, respectively. With the contact plate 14 so positioned, the first receiving space 34 of the contact plate 14 is aligned with the open top end of the pocket 166 and the second receiving space 36 of the contact plate 14 is aligned with the open bottom end of the pocket 166. Each contact plate 14 is pivotably movable within its pocket 160.

A plurality of signal contacts 170 are mounted to the housing 162 and extend downwardly therefrom. Each of the signal contacts 170 is a monolithic structure and is electrically conductive, being composed of a conductive metal, such as a tin plated copper alloy. Each signal contact 170 includes a fastening structure 76 joined at its neck to a tab (not shown). The fastening structures 76 are adapted to be press-fit into plated holes in a second PCB. The tabs of the fastening structures 76 are inserted through the open bottom ends into the pockets 166, respectively, so as to engage the contact plates 14, respectively. More specifically, within each pocket 166, the tab of the fastening structure 76 is received within the second receiving space 36 and the second inner space 40 of the contact plate 14, with the tab being pressed between the inner surfaces of the second end portions 28a,b of the contact plate 14.

It should be appreciated that the fastening structures 76 used in the connectors 152, 154 are not limited to having an EON-type of press fit construction. Instead, fastening structures having a different press-fit construction may be used, or the fastening structures may simply be elongated pins that are soldered into the holes of a PCB.

After the connectors 152, 154 are mounted to the first and second PCBs, the first and second PCBs are connected together by inserting the spades 160 of the connector 152 (secured to the first PCB) into the first receiving spaces 34 of the contact plates 14 of the connector 154 (secured to the PCB 100). If the first and second PCBs are misaligned in the direction of the front and rear sides of the housing 162, the spades 160 will contact the sloping inner surfaces of the first end portions 26a (or the first end portions 26b) of the contact plates 14, thereby pivoting the contact plates 14 about the tabs of the signal contacts 170, respectively. The side slots 168 in the housing 162 permit this pivoting.

It is to be understood that the description of the foregoing exemplary embodiment(s) is (are) intended to be only illustrative, rather than exhaustive. Those of ordinary skill will be able to make certain additions, deletions, and/or modifications to the embodiment(s) of the disclosed subject matter without departing from the spirit of the disclosure or its scope.

What is claimed is:

1. A connector for connection to a substrate for mounting electronic devices, the substrate having a plurality of holes formed therein, the connector comprising:
   a housing having opposing first and second end openings;
   a monolithic coupling contact pivotably disposed within the housing, the coupling contact comprising a pair of elements having opposing first and second end portions, respectively, the elements being joined together, intermediate the first and second end portions, with the first end portions being separated by a first space and the second end portions being separated by a second space, the first space being aligned with the first end opening in the housing and the second space being aligned with the second end opening in the housing; and
   a mounting contact partially disposed within the housing and having a bar section with opposing first and second edge portions, the bar section being disposed in the second space of the coupling contact such that the first edge portion is disposed toward where the elements are joined together, the mounting contact further having a fastening structure joined to and extending from the second edge portion of the bar section, the fastening structure being adapted for insertion into one of the holes of the substrate.

2. The connector of claim 1, wherein the connector comprises a plurality of the coupling contacts, and wherein each of the coupling contacts further comprises a cross bar having opposing ends joined to the elements, respectively; and
   wherein the coupling contacts are pivotable about an axis extending through the cross bars of the coupling contacts.

3. The connector of claim 2, wherein the housing has a plurality of pairs of the first and second end openings, and wherein the housing comprises a plurality of pockets arranged serially along its length, the pockets each having one of the pairs of the first and second end openings; and
   wherein the coupling contacts are disposed in the pockets, respectively.

4. The connector of claim 3, wherein the connector comprises a plurality of the mounting contacts, the bar sections of the mounting contacts being disposed in the second spaces of the coupling contacts, respectively.

5. The connector of claim 4, wherein each of the fastening structures is configured for press-fit insertion into one of the holes in the substrate and comprises a pair of resiliently movable beams separated by a piercing.

6. The connector of claim 2, wherein the coupling contacts are arranged in a stack in the housing such that the first spaces are aligned to form a first receiving groove in the stack and the second spaces are aligned to form a second receiving groove in the stack; and
   wherein the bar section of the mounting contact is disposed in the second receiving groove.

7. The connector of claim 6, wherein the housing further comprises a pair of opposing side walls, one of the side walls having an opening; and
   wherein the second receiving groove is aligned with the opening in the side wall of the housing.

8. The connector of claim 7, wherein the side walls each have an opening therein, the openings being aligned with the second receiving groove of the coupling contacts.

9. The connector of claim 8, wherein portions of the bar section extend through the openings in the side walls, respectively.

10. The connector of claim 7, wherein the mounting contact has a plurality of the fastening structures joined to the bar section.

11. The connector of claim 10, wherein each of the fastening structures is configured for press-fit insertion into one of the holes in the substrate and comprises a pair of resiliently movable beams separated by a piercing.

12. The connector of claim 10, wherein the bar section comprises a center beam having opposing ends joined by bends to arms, respectively.

13. The connector of claim 12, wherein two of the fastening structures are joined to lower portions of the arms, respectively, and a third one of the fastening structures is joined to a lower portion of the center beam.

14. The connector of claim 13, wherein the center beam is received in the second receiving groove formed by the coupling contacts.

15. The connector of claim 7, wherein the axis about which the coupling contacts are pivotable extends through the side walls;
   wherein the housing further comprises a pair of opposing second side walls, each having an enlarged opening therein; and
   wherein when the coupling contacts pivot about the axis, portions of the coupling contacts extend into one of the enlarged openings.

16. The connector of claim 1, wherein the housing is composed of plastic.

17. A method of connecting a rigid structure to a substrate for mounting electronic devices, the substrate having a plurality of holes formed therein, the method comprising:
   providing a coupler comprising a monolithic coupling contact disposed within a housing having opposing first and second end openings, the coupling contact comprising a pair of elements having opposing first and second end portions, respectively, the elements being joined together, intermediate the first and second end portions, with the first end portions being separated by a first space and the second end portions being separated by a second space, the first space being aligned with the first end opening in the housing and the second space being aligned with the second end opening in the housing;
   providing a mounting contact having a bar section with opposing first and second edge portions and a fastening structure joined to and extending from the second edge portion of the bar section;
   inserting the bar section of the mounting contact into the second space of the coupling contact such that the first edge portion is disposed toward where the elements are joined together;
   securing the fastening structure in one of the holes of the substrate; and
   inserting the rigid structure into the first space of the coupling contact.

18. The method of claim 17, wherein the rigid structure is a bus bar.

19. The method of claim 17, wherein the rigid structure is a bar of a connecting contact secured to a printed circuit board.

20. The method of claim 17, wherein the fastening structure has a press-fit construction; and
   wherein the step of securing the fastening structure comprises applying a force to the fastening structure sufficient to cause the fastening structure to deform and enter the hole.

* * * * *